United States Patent
Lin et al.

(10) Patent No.: US 9,343,558 B1
(45) Date of Patent: May 17, 2016

(54) SILICON CONTROLLED RECTIFIER

(71) Applicants: GLOBAL UNICHIP CORPORATION, Hsinchu (TW); TAIWAN SEMICONDUCTOR MANUFACTURING CO., LTD., Hsinchu (TW)

(72) Inventors: Chun-Yu Lin, Hsinchu (TW); Ming-Dou Ker, Hsinchu County (TW); Wen-Tai Wang, Hsinchu County (TW)

(73) Assignees: GLOBAL UNICHIP CORPORATION, Hsinchu (TW); TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 14/850,951

(22) Filed: Sep. 10, 2015

(30) Foreign Application Priority Data

May 8, 2015 (TW) ............................. 104114768 A

(51) Int. Cl.
| | | |
|---|---|---|
| *H01L 29/74* | (2006.01) | |
| *H01L 29/749* | (2006.01) | |
| *H01L 29/744* | (2006.01) | |
| *H01L 29/745* | (2006.01) | |
| *H01L 27/02* | (2006.01) | |

(52) U.S. Cl.
CPC ............ *H01L 29/749* (2013.01); *H01L 29/744* (2013.01); *H01L 29/745* (2013.01); *H01L 29/7455* (2013.01); *H01L 27/0262* (2013.01); *H01L 2924/13034* (2013.01)

(58) Field of Classification Search
CPC ... H01L 29/749; H01L 29/744; H01L 29/745; H01L 29/7455; H01L 27/0262; H01L 2924/13034
USPC .......................................................... 257/133
See application file for complete search history.

(56) References Cited

U.S. PATENT DOCUMENTS

| | | | |
|---|---|---|---|
| 4,896,243 A | 1/1990 | Chatterjee et al. | |
| 4,939,616 A | 7/1990 | Rountree et al. | |
| 6,765,771 B2 | 7/2004 | Ker et al. | |
| 7,057,215 B1* | 6/2006 | Vashchenko | H01L 29/87 257/133 |
| 7,910,998 B2 | 3/2011 | Hwang | |
| 7,915,638 B2 | 3/2011 | Tseng | |
| 8,373,267 B2 | 2/2013 | Gauthier | |
| 2008/0179624 A1 | 7/2008 | Russ | |

* cited by examiner

*Primary Examiner* — Tu-Tu Ho
(74) *Attorney, Agent, or Firm* — CKC & Partners Co., Ltd.

(57) ABSTRACT

A silicon controlled rectifier includes a substrate, a well, a deep doped region, a first doped region, a second doped region, a third doped region, and a fourth doped region. The well is disposed on the substrate and underneath a cell region. The deep doped region is disposed in the well. The first doped region has a first conductivity type, and is disposed in the well. The second doped region and third doped region have the first conductivity type and are disposed on the deep doped region. The fourth doped region has a second conductivity type, and is disposed between the second doped region and the third doped region. The fourth doped region is disposed on the deep doped region, and is electrically isolated from the well through the deep doped region, the second doped region, and the third doped region.

20 Claims, 5 Drawing Sheets

SILICON CONTROLLED RECTIFIER

RELATED APPLICATIONS

This application claims priority to Taiwan Application Serial Number 104114768, filed May 8, 2015, which is herein incorporated by reference.

BACKGROUND

1. Technical Field

The present disclosure relates to an electrostatic discharge (ESD) device. More particularly, the present disclosure relates to a silicon controlled rectifier of the ESD device.

2. Description of Related Art

Electrostatic discharge (ESD) protection devices have been widely applied to various electronic devices to improve reliability of the electronic devices. Silicon controlled rectifiers (SCR) are usually applied to various types of the ESD protection devices.

In some related approaches, the SCRs are implemented with multiple wells, resulting in a large cell area. In some other related approaches, the SCRs are implemented through a particular manufacturing process, for example, deep N-well. As a result, the layout area and the manufacturing cost are increased.

SUMMARY

An aspect of the present disclosure is to provide a silicon-controlled rectifier. The silicon-controlled rectifier includes a substrate, a well, a first deep doped region, a second doped region, a third doped region, and a fourth doped region. The well is disposed on the substrate and underneath a cell region. The first deep doped region is disposed in the well. The first doped region has a first conductivity type, and is disposed in the well, and is coupled to an anode of the silicon controlled rectifier. The second doped region and the third doped region have the first conductivity type and are disposed on the first deep doped region. The third doped region has the first conductivity type, and is disposed on the first deep doped region. The fourth doped region has a second conductivity type. The fourth doped region is disposed between the second doped region and the third doped region, and is coupled to a cathode of the silicon controlled rectifier. The fourth doped region is disposed on the first deep doped region, and is electrically isolated from the well through the first deep doped region, the second doped region, and the third doped region.

Another aspect of the present disclosure is to provide a silicon controlled rectifier that includes a substrate, insulating layers, a well, a first deep doped region, a second deep doped region, first doped regions, and second doped regions. The insulating layers are disposed on the substrate to define a cell region. The well is disposed on the substrate and in the cell region. The first deep doped region is disposed in the ell. The second deep doped region disposed in the ell. The first doped regions have a first conductivity type. A first one and a second one of the first doped regions are disposed on the first deep doped region, and a third one and a fourth one of the first doped regions are disposed on the second deep doped region. The second doped regions have a second conductivity type. A first one of the second doped regions is disposed on the first deep doped region and between the first one and the second one of the first doped regions, and a second one of the second doped regions are disposed on the second deep doped region and between the third one and the fourth one of the first doped regions It is to be understood that both the foregoing general description and the following detailed description are by examples, and are intended to provide further explanation of the invention as claimed.

BRIEF DESCRIPTION OF THE DRAWINGS

The disclosure can be more fully understood by reading the following detailed description of the embodiments, with reference made to the accompanying drawings as follows.

DETAILED DESCRIPTION

Figure 1A:
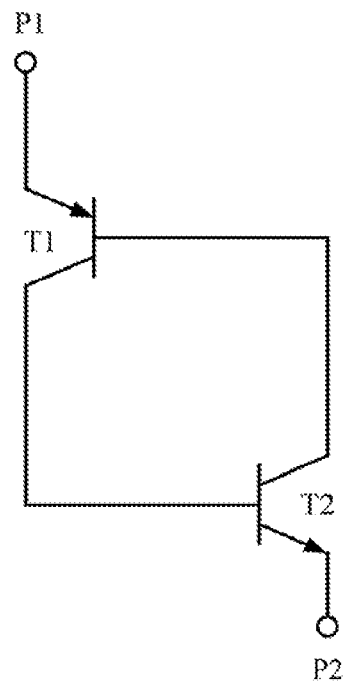
FIG. 1A is a circuit diagram of a silicon controlled rectifier (SCR) according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present disclosure It will be understood that when an element is referred to as being "on" another element, it can be directly on the other element or intervening elements may be present therebetween. In contrast, when an element is referred to as being "directly on" another element, there are no intervening elements present.

Furthermore, relative terms, such as "lower" or "bottom" and "upper" or "top" may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper", depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

In this document, the term "coupled" may also be termed as "electrically coupled", and the term "connected" may be termed as "electrically connected." "Coupled" and "connected" may also be used to indicate that two or more elements cooperate or interact with each other.

Figure 1B:
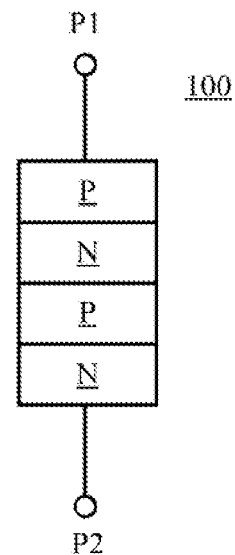
FIG. 1B is a schematic diagram illustrating equivalent internal junctions of the SCR in FIG. 1A according to some embodiments of the present disclosure.

Reference is now made to FIG. 1A and FIG. 1B. FIG. 1A is a circuit diagram of a silicon controlled rectifier (SCR) according to some embodiments of the present disclosure. FIG. 1B is a schematic diagram illustrating equivalent internal junctions of the SCR in FIG. 1A according to some embodiments of the present disclosure.

As shown in FIG. 1A, the SCR 100 includes a bipolar junction transistor (BJT) T1 and a BJT T2. An emitter of the BJT T1 is coupled to an anode P1 of the SCR 100, a collector of the BJT T1 is coupled to a base of the BJT T2, and a base of the BJT T1 is coupled to a collector of the BJT T2. An emitter of the BJT T1 is coupled to a cathode P2 of the SCR 100. With such arrangement, the SCR 100 is able to have a lower holding voltage and a lower turn-on resistance. Therefore, the SCR 100 is suitable to be applied in various types of electrostatic discharge (ESD) protection circuits.

Furthermore, as shown in FIG. 1A, the BJT T1 is a PNP type transistor, and the BJT T2 is an NPN transistor. Effectively, as shown in FIG. 1B, the BJT 100 includes four junctions P, N, P, and N.

The following embodiments are disclosed with accompanying diagrams for detailed description. For illustration clarity, many details of practice are explained in the following descriptions. However, it should be understood that these details of practice do not intend to limit the present disclosure. That is, these details of practice are not necessary in parts of embodiments of the present disclosure. Furthermore, for simplifying the drawings, some of the conventional structures and elements are shown with schematic illustrations.

Figure 2:
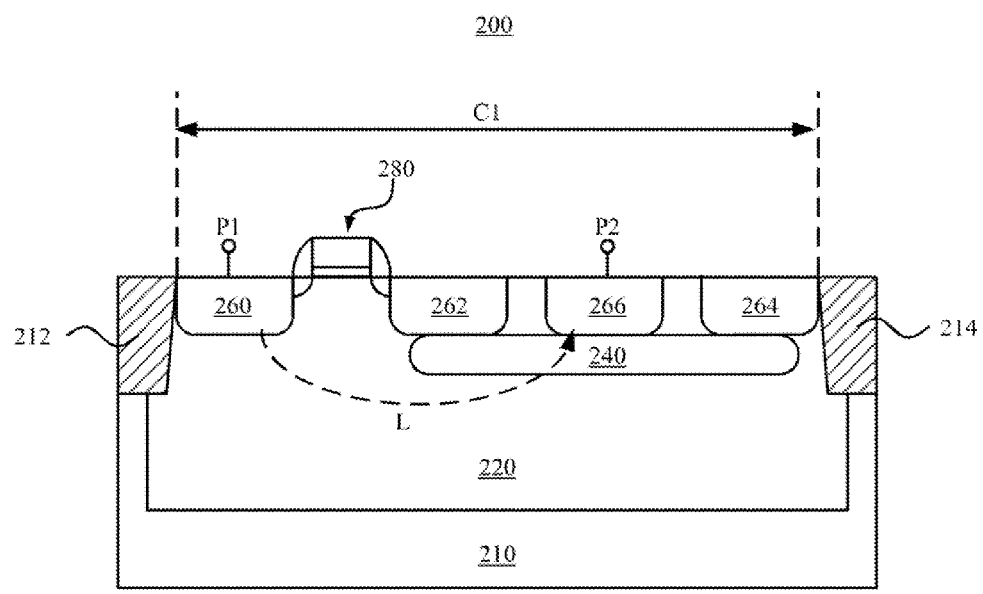
FIG. 2 is a cross-sectional view illustrating a schematic diagram of a SCR according to some embodiments of the present disclosure.

Reference is now made to FIG. 2. FIG. 2 is a cross-sectional view illustrating a schematic diagram of a SCR according to some embodiments of the present disclosure. As shown in FIG. 2, the SCR 200 includes a substrate 210, an insulating layer 212, an insulating layer 214, a well 220, a deep doped region 240, a doped region 260, a doped region 262, a doped region 264, and a doped region 266.

In some embodiments, the substrate 210 is a P-type substrate. As shown in FIG. 2, the insulating layer 212 and the insulating 214 are disposed on the substrate 210 to define a cell region C1. In some embodiments, as shown in FIG. 2, the insulating layer 212 and the insulating layer 214 are implemented with shallow trenches. Alternatively, in some other embodiments, the insulating layer 212 and the insulating layer 214 are implemented with other electrical insulated materials, e.g., silicon nitride layers.

In this embodiment, the well 220 is an N-well. As shown in FIG. 2, the well 220 is disposed on the substrate 210 and underneath the cell region C1. The deep doped region 240 is disposed in the well 220. The doped region 260, the doped region 262, and the doped region 264 are configured to have a first conductivity type, and to be disposed in the well 220. The doped region 266 has a second conductivity type, and is disposed in the well 220. The doped region 260 is coupled to the anode P1 of the SCR 200, and the doped region 266 is coupled to the cathode P2 of the SCR 200. The doped region 262, the doped region 264, and the doped region 266 are disposed on the deep doped region 240, and are in contact with the deep doped region 240.

In some embodiments, the deep doped region 240 is a P-type doped region. For example, the doped region 260, the doped region 262, and the doped region 264 are P-type doped regions, and the doped region 266 is an N-type doped region. Effectively, as shown in FIG. 2, the doped region 260, the well 220, the deep doped region 240 and the doped region 266 sequentially form the four junctions P, N, P, and N.

In a fabrication of complementary metal oxide semiconductor (CMOS), the deep doped region 240 can be applied to various types of ESD protection devices. In some embodiments, the deep doped region 240 is a P-ESD layer. By employing the deep doped region 240, the doped region 266 can be electrically isolated from the well 220. As a result, the SCR 200 can be implemented by a CMOS manufacturing process. Since the doped regions of the SCR 200 can be disposed in the same well 220, the circuit area of the SCR 200 is thus reduced. As a result, the manufacturing cost of the SCR 200 is saved. Moreover, person skilled in the art is able to adjust related parameters of the SCR 200 by adjusting process parameters (e.g., the thickness) of the deep doped region 240 according to requirements of actual applications.

In some related approaches, certain shallow trenches (not shown) are employed between the doped region 266 and the doped region 264 (or the doped region 262), so as to electrically isolate the doped region 266 from the well 220. However, with such arrangement, a leakage current may be occurred between the edge of the deep doped region 240 and the shallow trenches. As a result, the doped region 266 cannot be fully isolated from the well 220. In some other related approaches, the doped region 266 and the doped region 264 (or the doped region 262) are configured to be in contact with each other. However, with such arrangement, a junction between the doped region 266 and the doped region 264 cannot be well-formed in the fabrication. As a result, the performance of the SCR 200 may be reduced.

Compared to those approaches, in some embodiments, a predetermined distance is present between the doped region 266 and the doped region 264 (or the doped region 262) of the SCR 200, so that the electrical isolation can be achieved without the shallow trenches. As a result, the leakage current of the SCR 200 can be reduced, and the performance of the SCR 200 can be kept.

In some other embodiments, salicide blocking layers are disposed at spaces between the doped region 262, the doped region 264, and the doped region 266, so as to separate the doped region 262, the doped region 264, and the doped region 266 from each other. In some fabrications, the salicide blocking layers include a resistor protection oxide (RPO) layer.

In yet some embodiments, as shown in FIG. 2, the SCR 200 further includes a gate electrode 280. The gate electrode 280 is disposed on the cell region C1 and between the doped region 260 and the doped region 262. The gate electrode 280 is configured to separate the doped region 260 from the doped region 262, so as to define the layout positions of them. In various embodiments, the gate electrode 280 is a poly-silicon layer.

Figure 3:
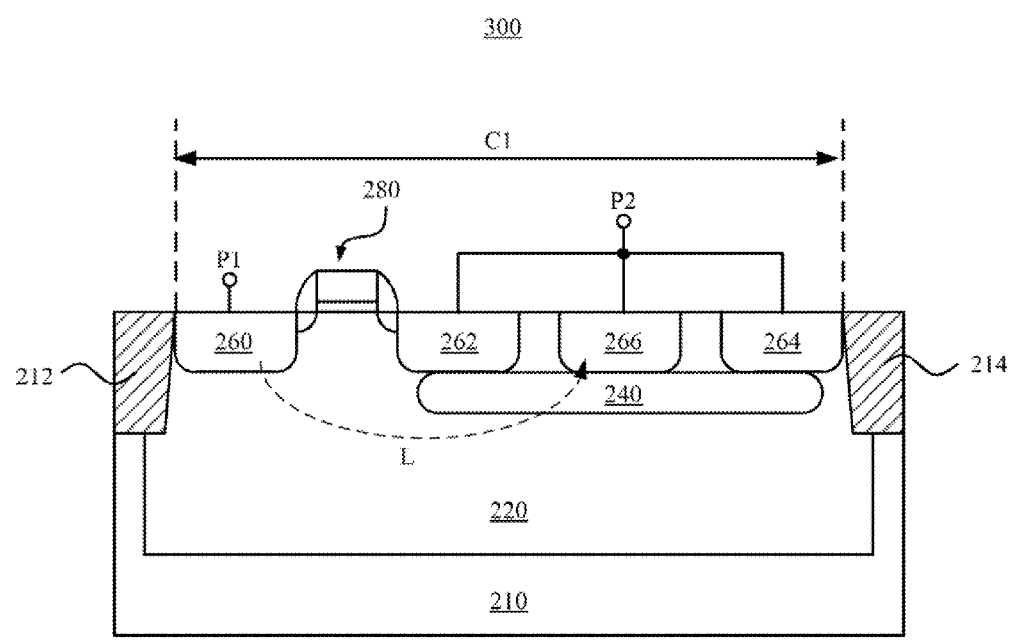
FIG. 3 is a cross-sectional view illustrating a schematic diagram of a SCR according to some embodiments of the present disclosure.

Reference is made to FIG. 3. FIG. 3 is a cross-sectional view illustrating a schematic diagram of a SCR according to some embodiments of the present disclosure. Compared to the SCR 200 in FIG. 2, in this embodiment, the doped region 262 and the doped region 264 of the SCR 300 are further configured to be coupled to the cathode P2 of the SCR 300.

Figure 4:
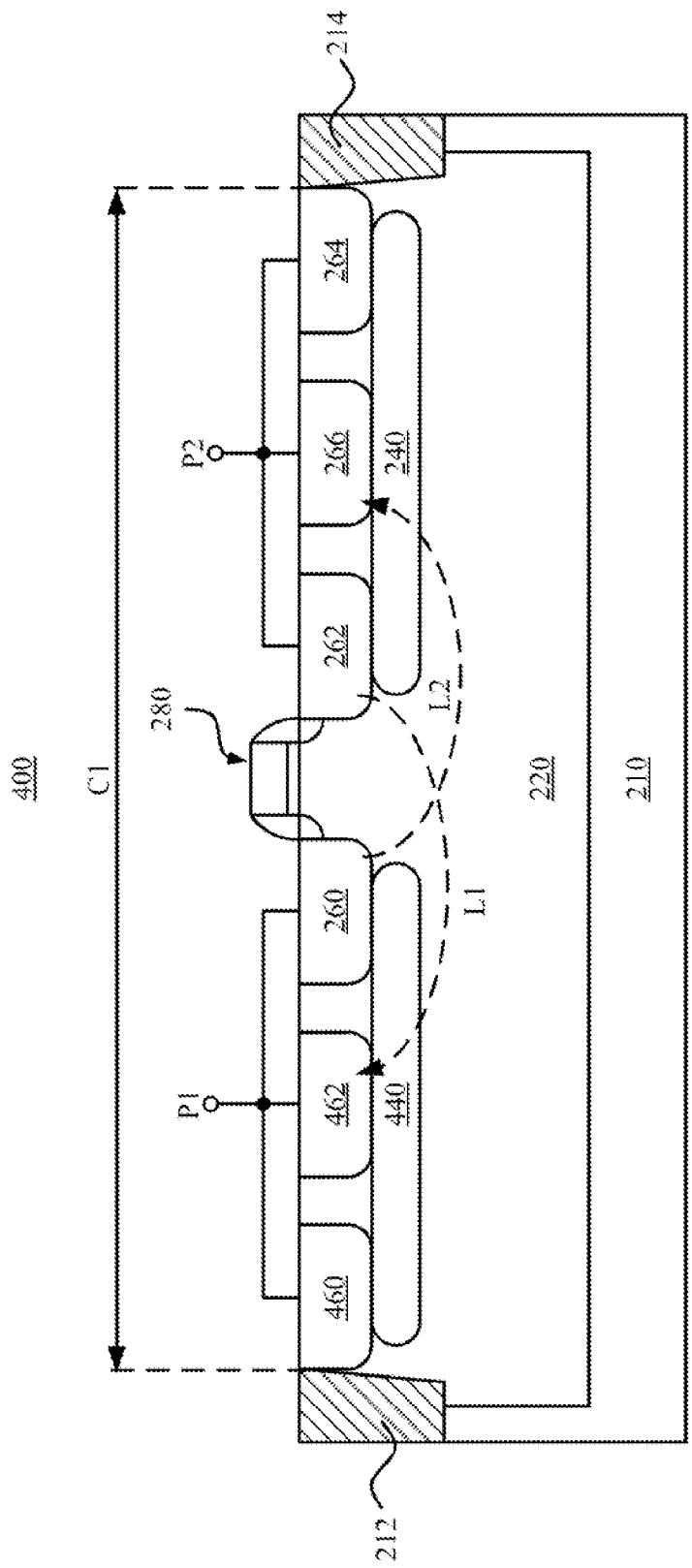
FIG. 4 is a cross-sectional view illustrating a schematic diagram of a SCR according to some embodiments of the present disclosure.

Reference is made to FIG. 4. FIG. 4 is a cross-sectional view illustrating a schematic diagram of a SCR according to some embodiments of the present disclosure. Compared to the SCR 300 in FIG. 3, in this embodiment, the SCR 400 further includes a deep doped region 440, a doped region 460, and a doped region 462. The deep doped region 440 is disposed in the well 220 and underneath the cell region C1. The doped region 460 is configured to have the first conductivity type, and the doped region 462 is configured to have the second conductivity type. The doped region 460, the doped region 462, and the doped region 260 are disposed in the well 220 and on the deep doped region 440. The doped region 462 is disposed between the doped region 460 and the doped region 260. The doped region 460, the doped region 462, and the doped region 260 are coupled to the anode P1 of the SCR 400. In yet some embodiments, the doped region 460, the doped region 462, and the doped region 260 are in contact with the deep doped region 440.

For example, the deep doped region 440 is a P-type deep doped region, the doped region 460, the doped region 260, the doped region 262, and the doped region 264 are P-doped regions, and the doped region 462 and the doped region 266 are N-doped regions. As a result, the doped region 262, the well 220, the deep doped region 440 and the doped region 462 sequentially form the four junctions P, N, P, and N along the dashed-line path L1. Similarly, the doped region 260, the well 220, the deep doped region 240 and the doped region 266 sequentially form the four junctions P, N, P, and N along the dashed-line path L2.

Alternatively stated, in this embodiment, the SCR 400 has a symmetrical structure that essentially forms two SCR components having a two-way arrangement. With such arrangement, more SCRs can be formed within the same well 220, and thus the manufacturing costs are reduced.

In the aforementioned embodiments, for illustrative purposes only, the well 220 is described as the N-well, and the deep doped region 240 and the deep doped region 440 are described as deep P-doped regions. The present disclosure is not limited in this regard. It is understood that the conductivity types of the well 220, the deep doped region 240, the deep doped region 440, and the doped regions 260, 262, 264, 266, 460, and 462 can be replaced.

Figure 5:
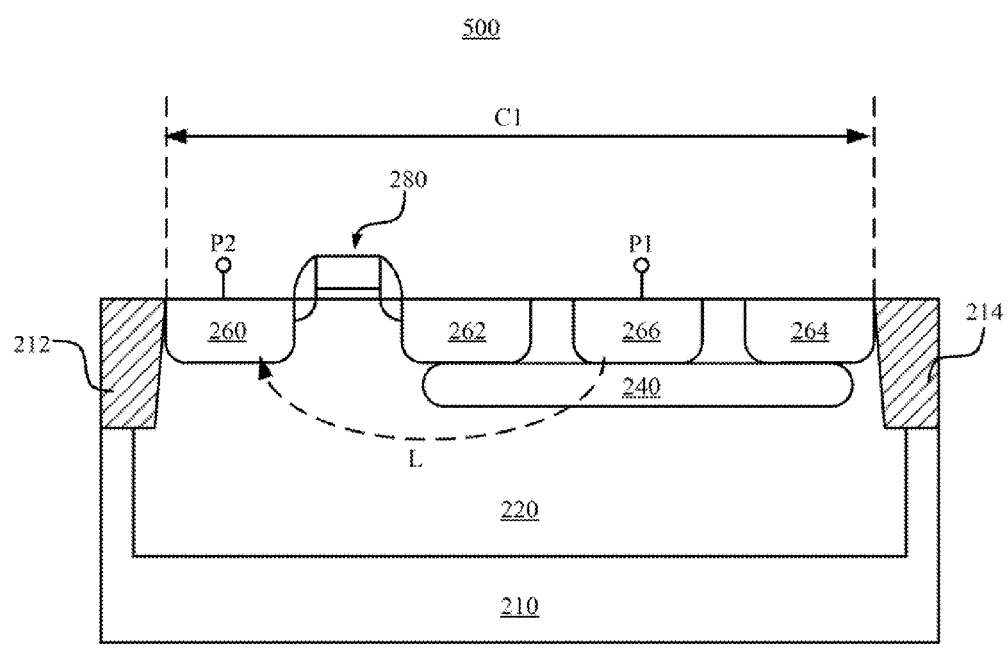
FIG. 5 is a cross-sectional view illustrating a schematic diagram of a SCR according to some embodiments of the present disclosure.

Reference is now made to FIG. 5. FIG. 5 is a cross-sectional view illustrating a schematic diagram of a SCR according to some embodiments of the present disclosure. For example, as shown in FIG. 5, in this embodiment, the well 220 is a P-well, and the deep doped region 240 is an N-type deep doped region, such as an N-ESD layer. The doped region 260 is coupled to the cathode P2 of the SCR 500, and the doped region 266 is coupled to the anode P1 of the SCR 500. The doped region 262 and the doped region 264 are N-type doped regions. The doped region 266 and the doped region 260 are P-type doped regions. Thus, the doped region 266, the deep doped region 240, the well 220, and the doped region 260 form the four junctions P, N, P, and N along the dashed-line path. L. The arrangement of the SCR 500 is similar with the arrangement of the SCR 200 in FIG. 2, and the repetitious descriptions are not given here.

In addition, it is understood that the arrangement of the SCR 500 can be implemented with the symmetrical structure of the SCR 400 as well. The arrangements of various embodiments are given for illustrative purpose only. Various arrangements that are applicable to various types of the ESD protection circuits are contemplated in the present disclosure.

In summary, the SCR of the present disclosure are able to be applied to various types of ESD devices. By employing the deep doped region, the leakage current of the diode of the present disclosure can be implemented with a single well, the layout area is accordingly reduced, and thus the manufacturing cost is saved. Moreover, with the deep doped region, the electrical isolation of the doped regions from the well can be achieved, and thus the better performance can be obtained.

It will be apparent to those skilled in the art that various modifications and variations can be made to the structure of the present disclosure without departing from the scope or spirit of the disclosure. In view of the foregoing, it is intended that the present disclosure cover modifications and variations of this closure provided they fail within the scope of the following claims.

What is claimed is:

1. A silicon controlled rectifier, comprising:
   a substrate;
   a well disposed on the substrate and underneath a cell region;
   a first deep doped region disposed in the well;
   a first doped region having a first conductivity type, wherein the first doped region is disposed in the well, and is coupled to an anode of the silicon controlled rectifier;
   a second doped region having the first conductivity type, wherein the second doped region is disposed on the first deep doped region;
   a third doped region having the first conductivity type, wherein the third doped region is disposed on the first deep doped region; and
   a fourth doped region having a second conductivity type, wherein the fourth doped region is disposed between the second doped region and the third doped region, and is coupled to a cathode of the silicon controlled rectifier;
   wherein the fourth doped region is disposed on the first deep doped region, and is electrically isolated from the well through the first deep doped region, the second doped region, and the third doped region.

2. The silicon controlled rectifier of claim 1, wherein the second doped region and the third doped region are coupled to the cathode.

3. The silicon controlled rectifier of claim 2, further comprising:
   a first insulating layer disposed on the substrate; and
   a second insulating layer disposed on the substrate and configured to define the cell region with the first insulating layer.

4. The silicon controlled rectifier of claim 2, further comprising:
   a gate electrode disposed on the cell region and between the first doped region and the second doped region.

5. The silicon controlled rectifier of claim 2, wherein the conductivity type of the well is different from the conductivity type of the first deep doped region.

6. The silicon controlled rectifier of claim 2, further comprising:
   a second deep doped region disposed in the well and underneath the cell region;
   a fifth doped region having the first conductivity type, wherein the fifth doped region is disposed in the well and on the second deep doped region; and
   a sixth doped region having the second conductivity type, wherein the sixth doped region is disposed in the well, on the second deep doped region, and between the first doped region and the fifth doped region, and the fifth doped region and the sixth doped region are coupled to the anode.

7. The silicon controlled rectifier of claim 6, further compsing:
   a first insulating layer disposed on the substrate; and
   a second insulating layer disposed on the substrate and configured to define the cell region with the first insulating layer.

8. The silicon controlled rectifier of claim 6, further comprising:
a gate electrode disposed on the cell region and between the first doped region and the second doped region.

9. The silicon controlled rectifier of claim 6, wherein the conductivity type of the well is different from the conductivity type of the first deep doped region.

10. The silicon controlled rectifier of claim 6, wherein the sixth doped region is electrically isolated from the well through the second deep doped region, the fifth doped region, and the first doped region.

11. The silicon controlled rectifier of claim 10, further comprising:
a first insulating layer disposed on the substrate; and
a second insulating layer disposed on the substrate and configured to define the cell region with the first insulating layer.

12. The silicon controlled rectifier of claim 10, further comprising:
a gate electrode disposed on the cell region and between the first doped region and the second doped region.

13. The silicon controlled rectifier of claim 10, wherein the conductivity type of the well is different from the conductivity type of the first deep doped region.

14. The silicon controlled rectifier of claim 1, further comprising:
a first insulating layer disposed on the substrate; and
a second insulating layer disposed on the substrate and configured to define the cell region with the first insulating layer.

15. The silicon controlled rectifier of claim 14, wherein the first insulating layer is a first shallow trench, and the second insulating layer is a second shallow trench.

16. The silicon controlled rectifier of claim 1, further comprising:
a gate electrode disposed on the cell region and between the first doped region and the second doped region.

17. The silicon controlled rectifier of claim 1, wherein the conductivity type of the well is different from the conductivity type of the first deep doped region.

18. The silicon controlled rectifier of claim 1, wherein the second doped region, the third doped region, and the fourth doped region are in contact with the first deep doped region.

19. A silicon controlled rectifier, comprising:
a substrate;
a plurality of insulating layers disposed on the substrate to define a cell region;
a well disposed on the substrate and in the cell region;
a first deep doped region disposed in the well;
a second deep doped region disposed in the well;
a plurality of first doped regions having a first conductivity type, wherein a first one and a second one of the first doped regions are disposed on the first deep doped region, and a third one and a fourth one of the first doped regions are disposed on the second deep doped region; and
a plurality of second doped regions having a second conductivity type, wherein a first one of the second doped regions is disposed on the first deep doped region and between the first one and the second one of the first doped regions, and a second one of the second doped regions are disposed on the second deep doped region and between the third one and the fourth one of the first doped regions.

20. The silicon controlled rectifier of claim 19, wherein the first one of the second doped regions, and the first one and the second one of the first doped regions are in contact with the first deep doped region, and the second one of the second doped regions, and the third one and the fourth one of the first doped regions are in contact with the second deep doped region.

* * * * *